United States Patent [19]

Yao et al.

[11] Patent Number: 5,746,512
[45] Date of Patent: May 5, 1998

[54] METHOD FOR REDUCING CRACK OF POLYSILICON IN A QUARTZ TUBE AND BOAT

[75] Inventors: Liang-Gi Yao, Taipei; Kuo-Shu Tseng, Hsinchu, both of Taiwan

[73] Assignee: Vanguard International Semiconductor Corporation, Hsinchu, Taiwan

[21] Appl. No.: 711,650

[22] Filed: Sep. 10, 1996

[51] Int. Cl.$^6$ .................................................. G01N 25/00
[52] U.S. Cl. .................................................. 374/45; 374/57
[58] Field of Search .............................. 374/4, 5, 15, 45, 374/57, 179

[56] References Cited

U.S. PATENT DOCUMENTS

| | | | |
|---|---|---|---|
| 3,788,135 | 1/1974 | Hammond, Jr. | 374/15 |
| 3,958,176 | 5/1976 | Kraeutle | 374/57 |
| 3,981,196 | 9/1976 | Zeuch et al. | 374/101 |
| 4,567,849 | 2/1986 | Wan | 374/12 |
| 4,770,542 | 9/1988 | Takagi et al. | 374/57 |

*Primary Examiner*—G. Bradley Bennett
*Attorney, Agent, or Firm*—Christensen, O'Connor, Johnson & Kindness PLLC

[57] ABSTRACT

The present invention relates to a method that reduces the thermal gradient at polymorphic transformation of polysilicon. The cooling rate of conventional furnaces is too rapid in currently used processes. The thermal process includes high stress from polymorphic transformation, which causes the peeling of a polysilicon film and microcracking of the quartz tube and wafer boat. The present invention suggests steps following of reducing cracks of polysilicon in a quartz tube and boat. At first, determines the temperature of polymorphic transformation of said quartz tube and boat. Next, reduces the temperature gradient during heating or cooling of said quartz tube and boat during said temperature of polysilicon transformation. Furthermore, the heating or cooling rates of the furnace is limited to the range of 0.1°–2° C./min to reduce the temperature gradient inside the furnace tube. Therefore, the thermal stress that is caused by the phase transition of the quartz is reduced by the invention and the particles and microcrack issues are also reduced by the invention.

13 Claims, 2 Drawing Sheets

METHOD FOR REDUCING CRACK OF POLYSILICON IN A QUARTZ TUBE AND BOAT

BACKGROUND OF THE INVENTION

1. Field of the Invention

The present invention relates to a method for reducing thermal gradient as to reduce thermal stress at polymorphic transformation of polysilicon, and more particularly, to a quartz tube and boat having reduced the peeling of polysilicon film and suppressed the microcrack of quartz tube and boat.

2. Description of the Prior Art

The semiconductor furnace is a cornerstone of the semiconductor manufacturing process. Common processes such as oxidation, diffusion, chemical vapor deposition, and annealing are performed in a furnace.

The "hot wall" type electric furnace has been used in the semiconductor industry for over 30 years. Such furnaces were originally designed for diffusion. More recently, these furnaces have also been used for low pressure chemical vapor deposition process.

In VLSI fabrication, the accurate control of oxide thickness and reduction in defects are more important than ever. The hot wall electric furnace is favored because batch processes are possible. Further, the hot wall furnace has excellent temperature stability. However, the hot wall furnace does have relative difficulty in providing precise temperature control.

Another type of furnace uses is the so called a "lamp annealing" furnace. The lamp annealing furnace has the advantage that a plurality of wafers can be treated and the process temperature can be precisely controlled. However, the lamp annealing furnace does not currently provide uniform temperature distribution over the entire wafer surface relative to the hot wall furnace.

Modern hot wall horizontal diffusion furnaces are capable of controlling temperature over the range of 300°–1200° C. to an accuracy of 0.5° or –0.5° C. over a length of up to 40 inches. A recent development in furnace technology is the vertical furnace. The major advantage of the vertical furnace system offers over a conventional system are (1) no cantilever or soft-landing is required since the wafers are held in a quartz boat which does not touch the process tube walls (2) the wafers can be loaded and unloaded automatically; (3) the clean room footprint of the system is somewhat smaller than for the conventional horizontal configuration. See, e.g. P. Burggraaf, "Vertical Furnaces", Semiconductor International, April, 1986.

FIG. 1 shows in schematic form a conventional vertical furnace system. A quartz furnace tube 2 is set on a bottom plate 4. A wafer boat 6 which carries wafers to be processed is set in the furnace tube 2. The furnace tube 2 serves to isolate the wafers and to provide heating. A cooling water means 8 is set in the bottom plate 4 for cooling down the temperature of the system when necessary.

Heating elements 10 are placed outside of the furnace tube 2 for providing heating of the furnace tube 2. Thermocouples 12 are set on the sidewall of the furnace tube 2 and pass through the side wall of the furnace tube 2 for detecting the temperature inside the furnace tube 2. When a process is completed, the process temperature must be cooled down to room temperature. However, the cooling rate of the furnace is too rapid in currently used processes. The rapid cooling thermal process results in high stress by polymorphic transformation, which causes the peeling of the polysilicon film of the furnace tube 2 and microcracking of the furnace tube 2 and wafer boat 6. The peeling of the polysilicon film not only creates affects the efficacy of the furnace tube 2, but also causes particles to be generated.

A quartz tube having a precoating of polysilicon on the tube is widely used for the deposition or annealing process. The main purpose of the polysilicon deposition is to reduce the power loss due to quartz reflection or radiation, and to protect the boat lifetime during periodical maintenance by wet etching.

However, the cooling rate of furnace is too rapid in currently used process for the throughput reason. The thermal process induces high stress of polymorphic transformation, which causes the peeling of polysilicon film and microcrack of quartz tube and boat. The peeling of polysilicon film not only creates the particle issues, but also has different etching rates for areas covered with or without polysilicon film.

SUMMARY OF THE INVENTION

A method for reducing thermal gradient at polymorphic transformation as to reduce thermal stress in a quartz tube and boat. The peeling of polysilicon film is reduced and the microcrack of quartz part is suppressed due to reducing the thermal stress.

The method mentioned above includes steps as following. At first, determines the temperature of polymorphic transformation of said quartz tube and boat. Next, reduces the temperature gradient during heating or cooling of said quartz tube and boat during said temperature of polysilicon transformation. The heating or cooling rate suggested in the present invention is limited to the range of 0.1°–2° C./min.

BRIEF DESCRIPTION OF THE DRAWINGS

Preferred embodiments of the invention will now be described in connection with the accompanying drawings, in which.

DESCRIPTION OF THE PREFERRED EMBODIMENT

A preferred embodiment of the present invention will be described hereinafter.

Figure 2:
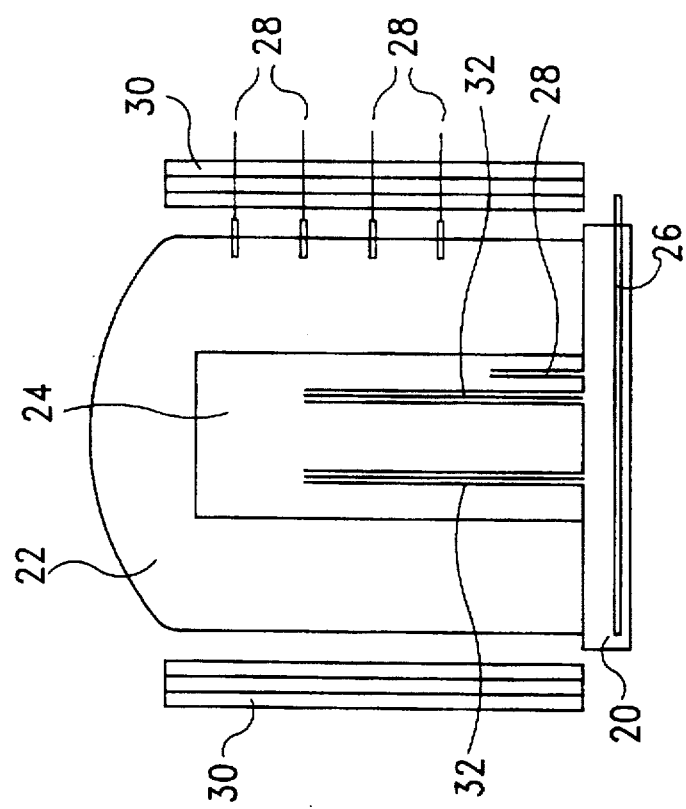
FIG. 2 is an embodiment of a furnace system to reduce particles in a quartz tube and boat in accordance with the present invention.
Figure 1:
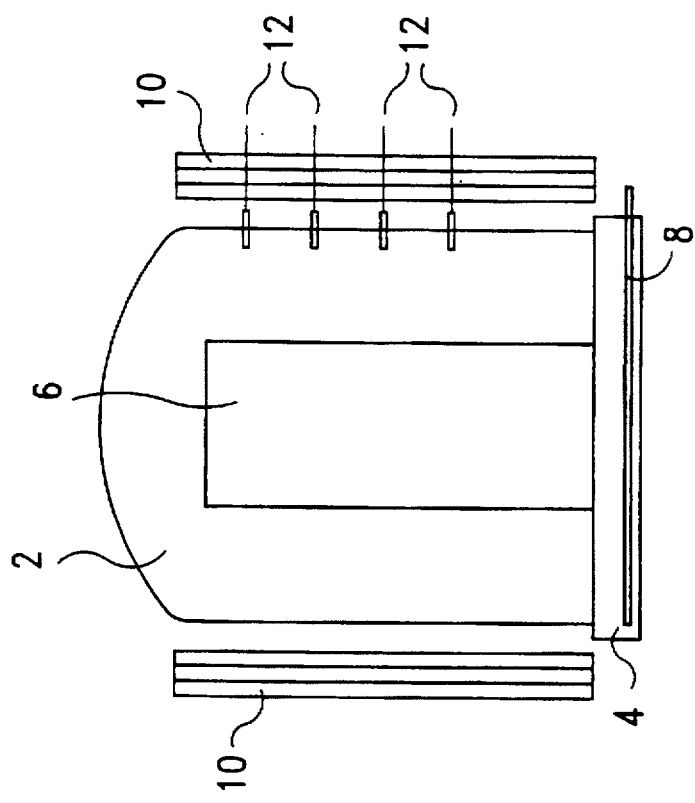
FIG. 1 is a conventional furnace system.

FIG. 2 shows a preferred embodiment of a semiconductor furnace system formed in accordance with the present invention. The furnace system is designed to minimize thermal stress, to reduce particle generation in the quartz tube and boat, and to prolong the lifetime of both quartzwares (the tube and boat).

The present invention is identical to a prior art vertical furnace except as detailed below. In brief, secondary heating elements are used to reduce the temperature gradient in the wafer boat during the cooling stage after the completion of a process. The furnace includes a bottom plate 20, a furnace tube 22, a wafer boat 24, a water cooling means 26, thermocouples 28, first heating elements 30, and second heating elements 32. The furnace tube 22 is set onto the bottom plate 20, which serves to isolate the wafers. The wafer boat 24 is then set in the furnace tube 22 to hold the wafer boat 24. Typically, the furnace tube 22 is made of quartz.

A cooling water unit 26 which is set in the bottom plate 20 is utilized to cool down the temperature of the system following completion of a process. The first heating elements 30 are set outside of the furnace tube 22 to provide heating of the furnace tube.

The second heating elements 32 are vertically set in the wafer boat 24 and on the bottom plate 20. The second heating elements 32 are used to reduce the temperature gradient in the wafer boat 24. The thermocouples 28 are used to detect the temperature inside the furnace tube 22 and inside the wafer boat 24. Some of the thermocouples 28 are set on the side wall of the furnace tube 22 and pass through the side wall of the furnace tube 22 for detecting the temperature in the furnace tube 22. Others are set in the wafer boat 24 for detecting the temperature in the wafer boat 24.

The key reason for thermal stress in the tube 22 and boat 24 is caused during phase transition of the quartz. There are three basic structures of crystalline silica: quartz, tridymite, and cristobalite. The most stable forms are low quartz, below 573° C.; high quartz, from 573°–867° C.; high tridymite, 867°–1470° C.; high cristobalite, 1470°–1710° C.; and liquid.

The common deposition temperature for polysilicon, low pressure chemical vapor deposition (nitride), and LPTEOS (low pressure tetraethylorthosilicate) are 586°–640° C., 760° C., and 720° C., respectively. The process temperature of densifying BPSG (borophosphosilicate glass), well drive-in, and field oxide are in the range between 800°–1150° C.

Figure 3:
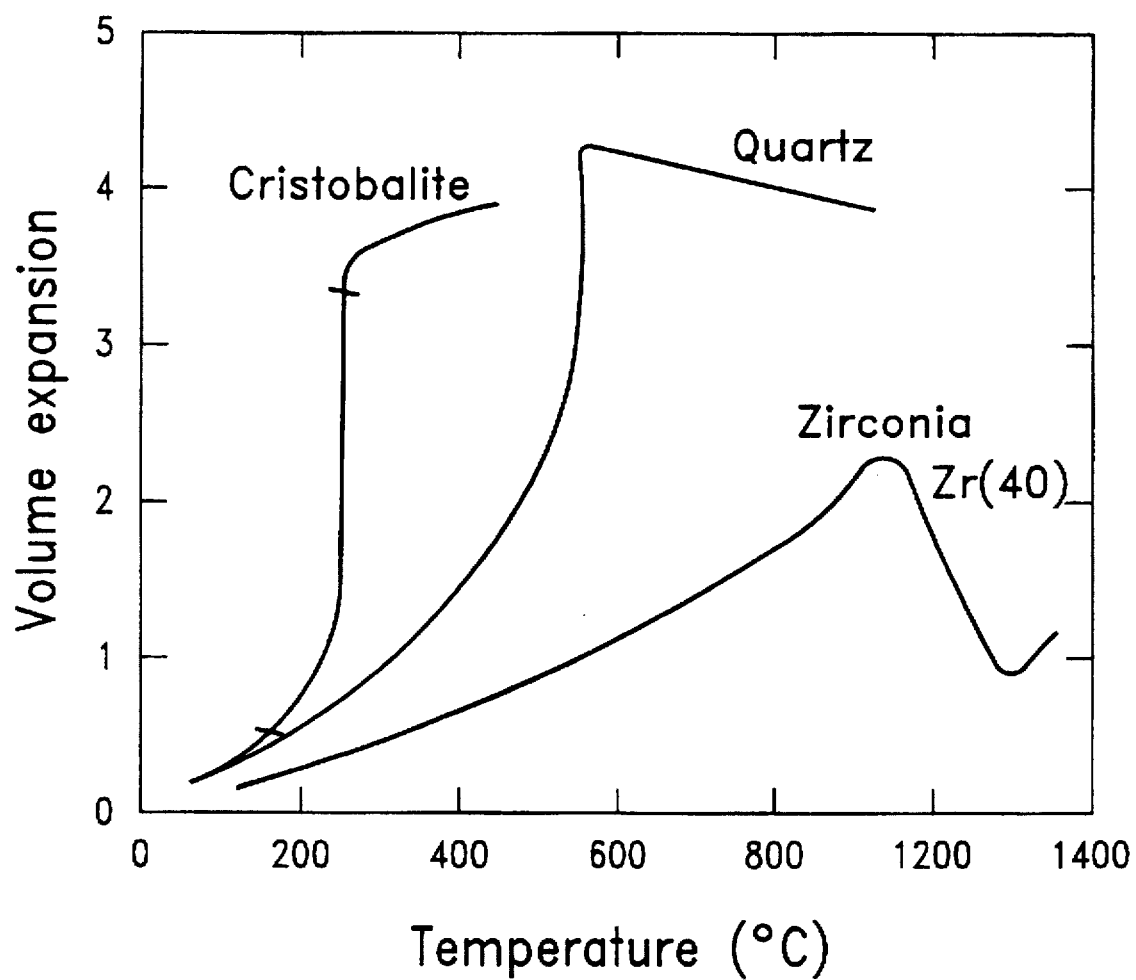
FIG. 3 describes thermal properties at polymorphic transformations of kinds of polysilicon.

FIG. 3 describes thermal properties at polymorphic transformations of kinds of polysilicon, such as quartz, cristobalite, and zirconia (See John Wiley and Sons Comp., W. D. Kingery, H. K. Bowen, and D. R. Uhlmann, Introduction to Ceramics, 2nd Edition, p.590–p.591). A thermal process of rapid heating or cooling rate of furnace that induces high stress of polymorphic transformation, which causes the peeling of polysilicon film and microcracks of quartz tube and boat. It is important to use a suitable cooling rate or heating rate in order to reduce the thermal stresses from polymorphic transformation in these ranges on the tube 22 and the boat 24. This can be achieved by suitable heating or cooling rates, such as 0.1°–2° C./min. Thus, in both cooling and heating phases of a particular semiconductor process, heating elements 32 will be activated when the thermocouples 28 indicate a temperature near any of the phase transformation ranges.

In particular, when the thermocouples 28 detect that the temperature is within a phase transformation range, second heating elements 32 will be activated to decrease the temperature gradient between the tube 22 and the boat 24. The thermal stress which is caused by the phase transition of the quartz is reduced by the present invention.

In FIG. 3, it is obvious that phase transformation from high quartz to low quartz will occur in the range from 575°–565° C. For a drive-in or annealing process, reversible transformation between high quartz and high tridymite occurs in the temperature range of 862°–872° C. The decrease of throughput could be minimized since lower heating or cooling rate of furnace only adopt in a short range of processing temperature.

A method according to the present invention that reduces thermal gradient at polymorphic transformation includes the steps following. At first, determines the temperature of polymorphic transformation of said quartz tube and boat. Next, reduces the temperature gradient during heating or cooling of said quartz tube and boat during said temperature of polysilicon transformation. Of course, to limit the heating or cooling rate to the range of 0.1°–2° C./min is the better.

As the present invention has been described with preferred embodiment, it will be obviously to those skilled in the art that various modifications may be made. These variations to the described embodiment of the present invention, the scope of which is limited by the following claims.

What is claimed is:

1. A method of reducing crack of polysilicon in a quartz tube and a boat, herein said method comprising the steps of:

determining a temperature of polymorphic transformation of said quartz tube and boat; and reducing the temperature gradient during heating and cooling of said quartz tube and boat during said temperature of polymorphic transformation.

2. The method according to claim 1, wherein said heating rates of the said quartz tube and boat is in a range of 0.1°–2° C./min.

3. The method according to claim 1, wherein said cooling rates of the said quartz tube and boat is in a range of 0.1°–2° C./min.

4. The method according to claim 1, wherein said polymorphic transformation in a cooling cycle from a high-temperature quartz to a low-temperature quartz occurs in the range of 575° C.–565° C.; said high-temperature quartz being in the range of 573°–867° C., said low-temperature quartz being in the range below 573° C.

5. The method according to claim 1, wherein said polymorphic transformation in a transformation between high-temperature quartz and high-temperature tridymite occurs in the range of 862° C.–872° C.; said high-temperature quartz being in the range of 573°–867° C., said high-temperature tridymite being in the range of 867°–1470° C.

6. A method of reducing crack of polysilicon in a quartz tube and a boat, herein said method comprising the steps of:

detecting a first temperature in said quartz tube by at least a first temperature-detecting device;

detecting a second temperature near said boat by at least a second temperature-detecting device; and controlling a change rate of a temperature between said quartz tube and said boat by a first heating device near said quartz tube and a second heating device near said tube.

7. The method according to claim 6, wherein said heating rates of the said quartz tube and boat is in a range of 0.1°–2° C./min.

8. The method according to claim 6, wherein said cooling rates of the said quartz tube and boat is in a range of 0.1°–2° C./min.

9. The method according to claim 6, wherein said first temperature-detecting device comprises a plurality of thermocouples.

10. The method according to claim 6, wherein said second temperature-detecting device comprises a plurality of thermocouples.

11. The method according to claim 6, wherein said first-heating device is set outside of said quartz tube for providing heat to said quartz tube.

12. The method according to claim 6, wherein said second-heating device is set inside of said quartz tube for providing heat to said quartz tube.

13. The method according to claim 6, said quartz tube further comprising a cooling device for lowering said temperature between said quartz tube and said boat.

* * * * *